United States Patent [19]
Adolfsson et al.

[11] 4,417,140
[45] Nov. 22, 1983

[54] FIBRE OPTIC MEASURING DEVICE WITH ELECTRICALLY CONTROLLED PHOTOLUMINESCENCE

[75] Inventors: Morgan Adolfsson; Torgny Brogårdh; Christer Ovren, all of Västerås, Sweden

[73] Assignee: ASEA Aktiebolag, Västerås, Sweden

[21] Appl. No.: 275,789

[22] Filed: Jun. 22, 1981

[30] Foreign Application Priority Data

Jun. 23, 1980 [SE] Sweden ............................... 8004602

[51] Int. Cl.$^3$ ............................................... G01D 5/26
[52] U.S. Cl. .................................. 250/227; 250/231 R
[58] Field of Search ................... 250/231 R, 227, 212, 250/226, 551

[56] References Cited

U.S. PATENT DOCUMENTS

4,249,076  2/1981  Bergstrom et al. ......... 250/231 R X
4,270,050  5/1981  Brogårdh ...................... 250/231 R Primary Examiner—David C. Nelms
Assistant Examiner—Edward P. Westin
Attorney, Agent, or Firm—Watson, Cole, Grindle & Watson

[57] ABSTRACT

The invention relates to a fiber-optically coupled measuring device which has an optically energized transducer section which produces signal information in an optical form, the energy supply for the transducer section and the signal information therefrom being transmitted via a light guide fiber. The signal information is transmitted to a receiver at a location remote from the transducer section, the signal information being modified in response to electrical signals fed to a light emitting component of the transducer section.

22 Claims, 11 Drawing Figures

FIBRE OPTIC MEASURING DEVICE WITH ELECTRICALLY CONTROLLED PHOTOLUMINESCENCE

TECHNICAL FIELD

The present invention relates to a fiber-optically coupled measuring device which has an optically energised transducer section which produces signal information in an optical form, the energy supply for the transducer section and the signal information therefrom being transmitted via light guide fiber means.

In an optically supplied electronic system, or when using optically coupled measuring transducers which require some form of excitation energy, energising power has to be transmitted in one direction and signal information in the opposite direction.

BACKGROUND ART

It has been proposed to use changes in the light emitted by a body of temperature-dependent photo-luminescent material as a measure of the temperature at a remote location, by making the body luminescence through the supply of excitation light to it and to determine the temperature of the body by sensing a parameter of the luminescent light received from the body. It has been proposed to use a common light guide fiber for transmitting the excitation and luminescent light, to and from the body.

This invention relates to an extension of this prior proposal by using a body that permits a parameter of the luminescent light to be affected electrically, and thereby enables signal information relating to a range of different values sensed at one location to be transmitted to a remote location.

The references to "light" in this specification should be taken to include electromagnetic radiation which is not necessarily in the visible region of the spectrum, and references to "photo-luminescence", "photo-diode" and "light-emitting diode" (or "LED") should also be taken to include properties and devices operating in regions outside the visible spectrum (e.g. in the IR and UV).

DISCLOSURE OF INVENTION

According to the invention a fiber optically coupled measuring device comprises, an optically energised transducer section for generating signal information in optical form from a body of photo-luminescent material, a receiving section remote from the transducer section for producing a mesuring signal from said signal information, means for producing excitation light for the said body in the transducer section, the fiber optic means for feeding excitation light to the transducer section and for passing signal information from the transducer section to the receiving section, wherein the said body has electrically-dependent photo-luminescent properties such that the optical signal information it generates is modified by an electrical signal applied thereto, and said transducer section includes transducer means to produce an electrical signal which varies in dependence on a parameter to be measured and to feed said electrical signal to the body.

The invention is based on the fact that there is a concentration of optically excited minority charge carriers in the active region of an illuminated diode. There is a certain probability that the minority charge carriers will recombine with radiating recombination, which results in light being emitted.

The process described above is called photo-luminescence, and the intensity of the light which is emitted is a function of the concentration of minority charge carriers. This concentration can be controlled externally by controlling the number of charge carriers which are tapped from the active region. This can be done by changing the working point of the current/voltage characteristic of the diode, for example by changing the current output from the diode.

BRIEF DESCRIPTION OF DRAWINGS

The invention will be exemplified in greater detail, by way of example, with reference to the accompanying drawings, in which.

DESCRIPTION OF SPECIFIC EMBODIMENTS

Figure 1:
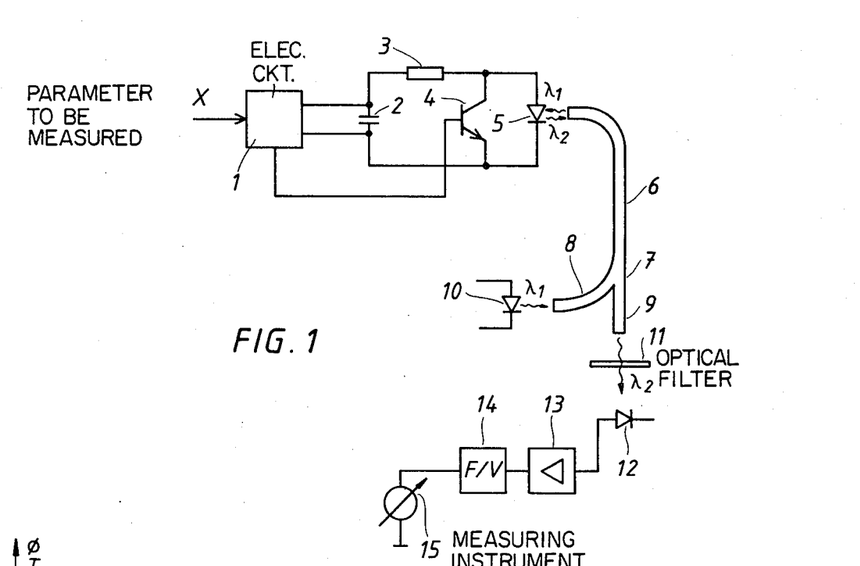
FIG. 1 is a circuit diagram of one embodiment of device according to the invention, FIG. 2 gives the spectra of three components in the circuit of FIG. 1, FIG. 3 schematically illustrates one way of producing a photo-luminescent diode for the device of FIG. 1, FIGS. 4 and 5 indicate the mode of working of the photo-luminescent diode of FIG. 3.

FIG. 1 shows how a photo-luminescent diode is used in an optically energised measuring system. An LED 10 feeds light of a wavelength $\lambda_1$ into a light guide fiber 8. The light passes a fiber branch 7 and a fiber 6 and illuminates a photo-luminescent diode 5. Supply power is taken from the diode 5, via an electronic filter consisting of a resistor 3 and a capacitor 2, to an electronic circuit 1. The electronic circuit 1 transforms a quantity to be measured—here designated X and being the quantity to be measured by the device according to the invention—into coded form, for example a frequency, and controls a transistor 4 which modulates the current output from the photo-luminescent diode 5. Since the supply of the electronic circuit 1 takes place via an electrical filter, the modulation is prevented from influencing the supply voltage. The modulation of the current output from photo-luminescent diode 5 also causes the photo-luminescence from the diode 5 to become modulated. The luminescence has the wavelength $\lambda_2$ and is transmitted via the light guide fiber 6, the branch fiber 7, a fiber 9 and an optical filter 11 to a photo-diode 12. The task of the filter 11 is to remove any reflected light at the wavelength $\lambda_1$. The output current from the photo-diode 12 constitutes an illustration of the modulation of the photo-luminescent diode 5. After amplification of the photo-current from an amplifier 13, the measuring signal is decoded in an electronic circuit 14, shown in FIG. 1 as a frequency/voltage converter. The output signal from the circuit 14 gives the measured value of the quantity X on a measuring instrument 15.

Figure 2:
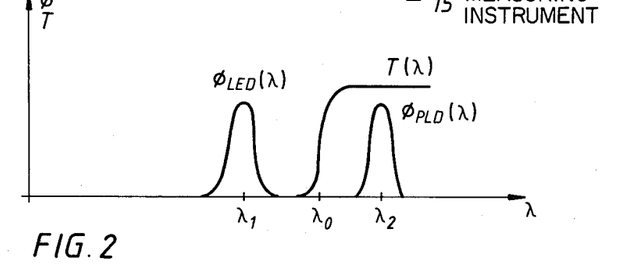

FIG. 2 shows the spectrum of the light emitted by the LED 10 (designated $\phi_{LED}(\lambda)$), the transmission curve of the filter 11 (designated $T(\lambda)$), and the spectrum of the luminescent light from the photo-diode 5 (designated $\phi_{PLD}(\lambda)$).

Figure 3:
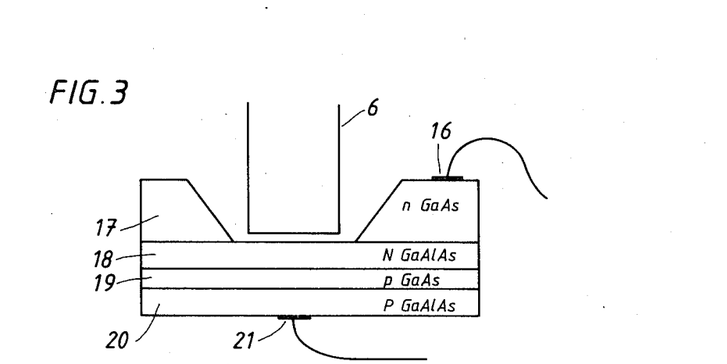

FIG. 3 shows one form of photo-luminescent diode based on GaAs/GaAlAs. On a substrate 17 of GaAs there are formed in successive order by liquid phase epitaxy, an N-layer 18 of GaAlAs, a p-doped layer 19 of GaAs and a P-doped layer 20 of GaAlAs. Through the substrate 17 a hole is etched, through which the end of the fiber 6 protrudes. The Al content in the layer 18 is so high that the transmission of light at the excitation wavelength $\lambda_1$ through the layer 18 is also high. When the structure is illuminated by light of the wavelength $\lambda_1$, the main part of the absorption, and thus the generation of minority charge carriers, takes place in the active GaAs layer 19. The active layer 19 is limited partly by the pN heterojunction (two semiconductor materials having different band gaps) formed between the layers 18 and 19, and partly by the pP junction formed between the layers 19 and 20. Because the layer 20 is made of a material having a higher band gap, minority charge carriers are prevented from penetrating into the layer 20. The photo-luminescent diode is provided with metallized contacts 16 and 21.

Figure 4:
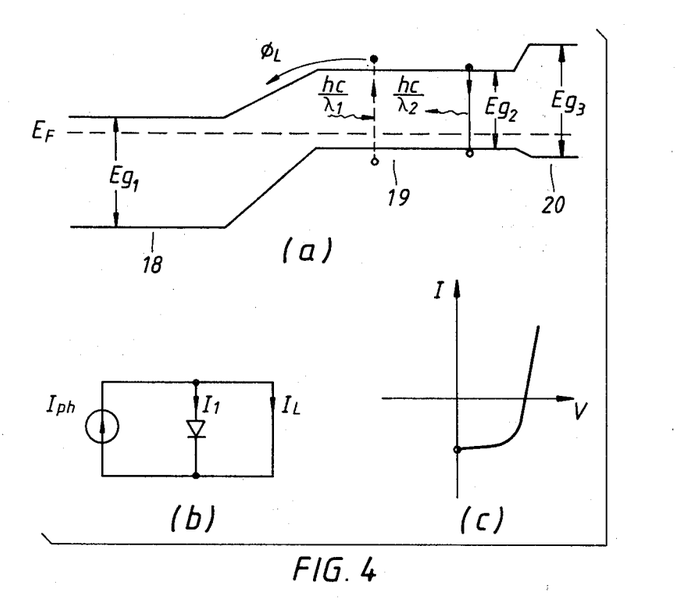
Figure 5:
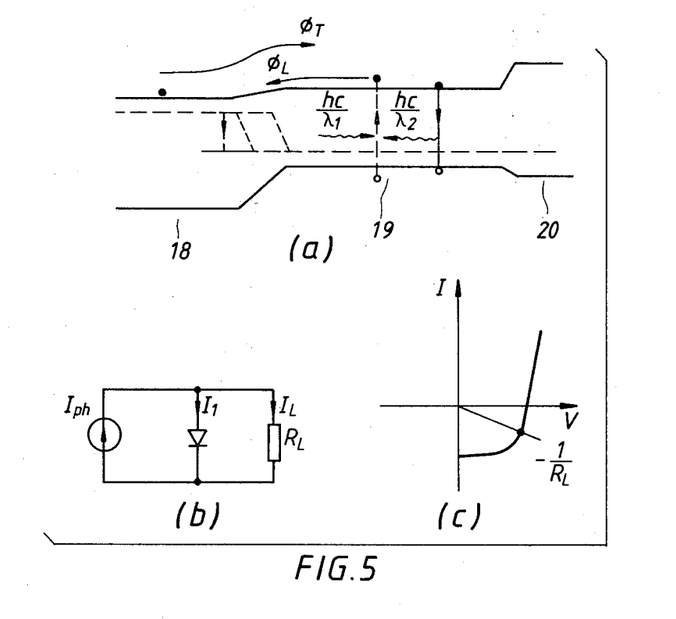

The function of the photo-luminescent diode will be further explained with reference to FIGS. 4 and 5, where, in each case, (a) represents a band diagram, (b) represents an equivalent circuit diagram, and (c) denotes the working point in the form of a current/voltage diagram. FIG. 4 shows a short-circuited photo-luminescent diode, and FIG. 5 shows a diode loaded with a resistance $R_L$. The band diagram in FIG. 4a, shows the active layer 19 surrounded by two layers having greater band gaps, 18 and 20. Because the diode is short-circuited, there is no voltage across the pN junction and therefore the Fermi level is constant throughout the structure. If the diode is illuminated by light of wavelength $\lambda_1$, where $Eg_1 > hc/\lambda_1 > Eg_2$ ($Eg_1$ being the band gap in layer 18 and $Eg_2$ the band gap in layer 19), the light has a high transmission through the layer 18, and the main part of the light is absorbed in the layer 19, which leads there to the formation of minority charge carriers, in this case electrons. The electrons are prevented from penetrating into the layer 20 by the potential barrier which is caused by the band gap $Eg_3$ in the layer 20 being greater than the band gap $Eg_2$. The addition of optically excited electrons to the active layer 19 is balanced by two processes. Electrons are passed across the pN junction between the layers 19 and 18, which gives rise to an electron flux $\phi_L$ from the layer 19, which gives the short-circuit current of the diode. In addition, electrons in the layer 19 have a certain probability of recombining with holes. Part of this recombination is radiating, which results in photons of energy $hc/\lambda_2$ being emitted. The intensity of the emitted radiation depends on the concentration of the minority charge carriers in the layer 19.

FIG. 4b shows an equivalent diagram for a short-circuited photo-luminescent diode, where the diode is represented by a current source, which provides the short-circuit current $I_{ph}$, caused by optical excitation, in parallel with an ideal diode. Upon a short-circuit, the entire optically excited current $I_{ph}$ passes through the external short-circuit, the current $I_I$ through the ideal diode being zero.

FIG. 4c shows the current/voltage characteristic of the photo-luminescent diode. The working point for a short-circuited diode is marked by a ring on the current axis in FIG. 4c.

The band diagram of a photo-luminescent diode, where a load resistance $R_L$ is coupled across the connections, is shown in FIG. 5a. Compared with the band diagram in FIG. 4a, FIG. 5a differs only in that a voltage is now applied across the diode. The voltage is caused by the current which passes through the load resistance $R_L$. Because the voltage V across the diode is no longer zero, the Fermi level varies through the diode, and the potential barrier in the pN junction is much lower than the case of a short-circuited diode. The low potential barrier makes it possible for majority charge carriers, electrons in the layer 18, to penetrate into the layer 19. The electrons give an electron flux $\phi_T$, which is opposite to the flux $\phi_L$ caused by the optically excited electron surplus in the layer 19. The electron concentration in the layer 19 will thus be higher than with a short-circuited diode. This leads to a higher intensity of the light from a radiating recombination in the layer 19. In the limiting open circuit case where $R_L \to \infty$, the electron fluxes $\phi_L$ and $\phi_T$ will cancel each other, and therefore all the electrons which are formed by optical excitation will disappear through recombination in the active layer 19, and the intensity of the radiation caused by these recombinations will be high. The internal quantum efficiency is determined by the number of electrons which recombine with light emission, and the number of electrons which recombine via other processes, for example via defects in the layer 19 or in its boundary surfaces.

An equivalent circuit diagram of the photo-luminescent diode, coupled to a load resistance $R_L$, is shown in FIG. 5b. The current $I_{ph}$ is divided between the ideal diode and the load resistance.

FIG. 5c shows the current/voltage characteristic curve of the photo-luminescent diode and the load line of the resistance $R_L$. The intersection of the curve and the line defines the working point of the circuit. By modulating the resistance $R_L$, the current from the photo-luminescent diode can be modulated. If the photo-luminescent diode is made such that the thickness of the active layer 19 is smaller than the diffusion length $L_n$ (a material parameter determined by the purity and quality of the semiconductor material) in the active layer, the concentration of minority charge carriers and thus the luminescence from the photo-luminescent diode will be modulated at the same rate as $R_L$.

Figure 6:
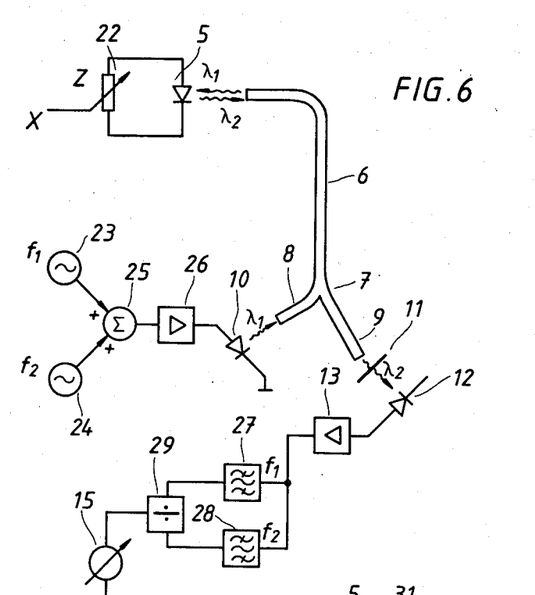
FIG. 6 is a second embodiment of measuring device where a photo-luminescent diode is used together with a transducer element.

FIG. 6 shows a measuring device, where the photo-luminescent diode 5 is in circuit with a transducer element 22, the frequency dependence of which is influenced by the the quantity X to be measured. The transducer element 22 may be inductive or capacitive and may also contain a resistive component. The quantity to be measured may influence the inductance, the capacitance and/or the resistance (Z is the impedance). The mode of operation of the measuring device shown in FIG. 6, is as follows:

Two oscillators 23 and 24 generate electrical signals of different frequencies $f_1$ and $f_2$, respectively. These signals are added in a summation circuit 25 and, via a drive circuit 26, supply current through an LED 10. The light emitted by the LED 10 has the wavelength $\lambda_1$. The emitted light enters a fiber 8, passes through a fiber branch 7 and a fiber 6 and illuminates the photo-luminescent diode 5 which is connected in parallel with the impedance 22, which impedance 22 constitutes the transducer element. The frequency dependence of the impedance 22 is influenced by the quantity X being measured, and therefore the current through the diode 5 will be frequency-dependent and also influenced by the quantity being measured. The light emission from the photo-luminescent diode 5 is dependent on the electrical current flowing through it and will therefore be frequency-dependent and influenced by the quantity to be measured. The light emitted from the diode 5 has the wavelength $\lambda_2$ and is transmitted back via the fiber 6, the fiber branch 7, a light guide fiber 9 and an optical filter 11 to a photo-diode 12. The filter 11 serves to filter away any components of the excitation wavelength $\lambda_1$. The current from the photo-diode 12 is amplified in an amplifier 13, the output signal of which is divided into the frequency components $f_1$ and $f_2$ by means of band pass filters 27 and 28, respectively. The quotient between the two frequency components of the output signal is formed in a dividing circuit 29, the output signal of which gives the measuring signal to an instrument 15.

By utilizing two frequencies $f_1$ and $f_2$, two independent variables can be transmitted, one being the measured value and the other being variations in the optical transmission, which can then be divided away.

The transducer element 22 may consist of one or more components, the frequency properties of which are changed by the quantity (X) to be measured. The frequency properties are arranged to be analyzed by measuring with several frequencies, by measuring phase shift, time delay and/or time constant, to derive the measuring signal and compensate for variations in the optical transmission.

Figure 7:
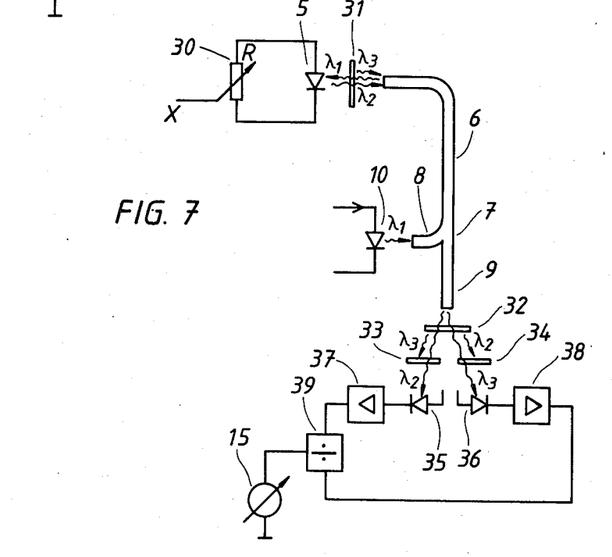
FIG. 7 shows an analog measuring device according to the invention.

The photo-luminescent diode in combination with resistive transducer elements can be used for direct analog mesurements. Piezo-resistive materials, thermistors or magneto-diodes can be used as the transducer element. In such a system compensation must take place for variations in the transmission of the optical system. FIG. 7 shows an analog measuring system, where the photo-luminescence from a material 31 functions as a reference signal and provides one simple way of compensating for variations in the transmission of the optical system. Current is driven through an LED 10, the emitted light of which has the wavelength $\lambda_1$ and is transmitted to a photo-luminescent diode 5 via a light guide fiber 10, a fiber branch 7, and a fiber 6. Simultaneously with the photo-luminescent diode 5, there is also illuminated a layer 31 of a material which emits photo-luminescence of the wavelength $\lambda_3 \neq \lambda_2$, $\lambda_2$ being the wavelength of the light emitted from the photo-luminescent diode 5. A resistive transducer element 30, whose resistance is controlled by the quantity X to be measured is connected in parallel with the photo-luminescent diode 5. The electrical current through, and thus the light emitted from, the photo-luminescent diode 5 are thereby controlled by the quantity X to be measured. The luminescence signals at both wavelength $\lambda_2$ and $\lambda_3$, are returned to the instrument side of the measuring device via the fiber 6, the fiber branch 7, and a light guide fiber 9. Any components of the excitation light having the wavelength $\lambda_1$ are eliminated in an optical filter 32. The light components of the wavelengths $\lambda_2$ and $\lambda_3$ pass through the filter 32 and are separated, respectively, by means of two optical filters, 33 and 34, each component then passing to a photo-diode 35, 36. The signals from the photo-diodes 35, 36 are amplified in amplifiers 37 and 38, respectively, and the quotient between them is formed in a dividing circuit 39. In the dividing circuit 39 a signal proportional to the light from the photo-luminescent diode 5 is divided by a signal which is proportional to the reference signal. This procedure reduces the dependence of the measuring device on the optical transmission properties of the optical components. The output signal from the circuit 39, gives the measured value on the instrument 15.

Figure 8:
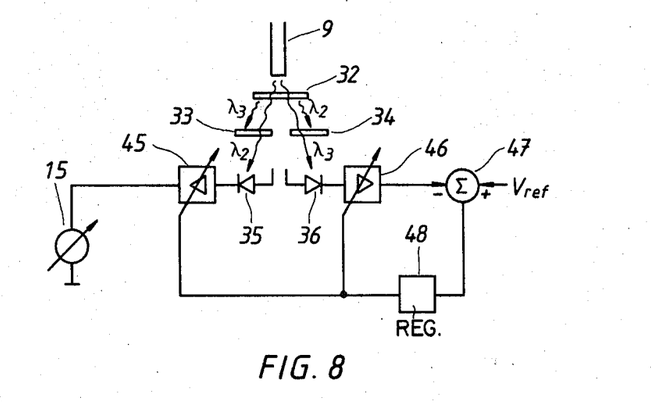
FIG. 8 shows an alternative arrangement for the reception of signals and signal processing in the device of FIG. 7.

Instead of forming the quotient, the transmitted reference signal may be used for controlling the amplification of an electrical component in the measuring signal processing circuit. FIG. 8 shows how the reception and signal processing may be arranged in that case. The transmitted optical reference signal gives rise to a current in the photo-diode 36, this current then being amplified in a variable amplifier 46, the output signal of which is passed to a summation circuit 47. In the circuit 47 the difference is formed between the signal from the amplifier 46 and a reference voltage $V_{ref}$. The difference signal is supplied to a regulator 48, the output signal of which controls the amplification of the variable amplifier 46 so that the difference signal from the circuit 47 becomes zero. The output signal from the regulator 48 also controls the amplification of a second variable amplifier 45, where the transmitted measuring signal generated by the photo-diode 35 is amplified before it is supplied to the instrument 15. If the amplifiers 45 and 46 are identical, the measuring signal supplied to the instrument 15 will be independent of variations in the optical transmission path.

The body of photo-luminescent material may include one part of a material the luminescence of which can be electrically controlled and another part with photo-luminescent properties that is not electrically modulated by an electrical signal. The other part emits light at a different wavelength from the one part and therefore serves as a reference signal. The other part of the body is a frequency converter.

Figure 9:
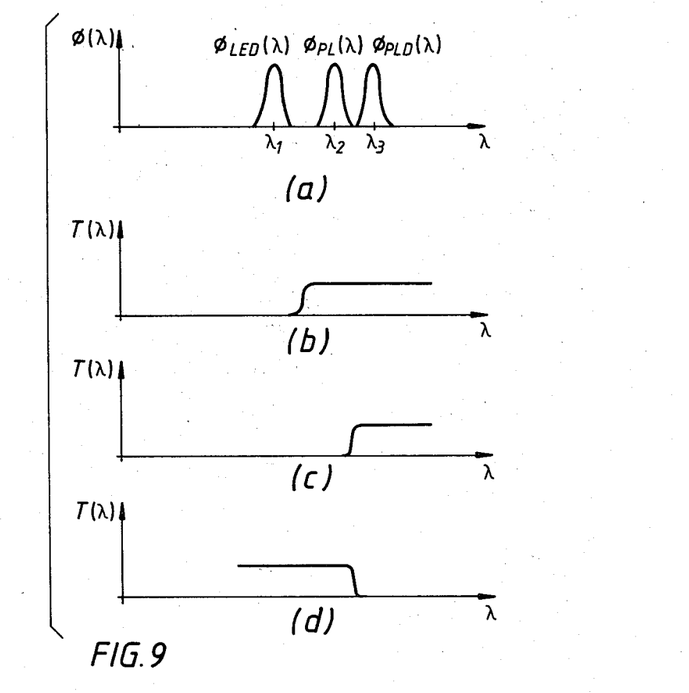
FIG. 9 shows the emission spectra for the excitation LED, the photo-luminescent diode and the photo-luminescent material of FIG. 7, FIG. 10 indicates an alternative form for the luminescent body of a device according to the invention.

FIG. 9a shows the emission spectra for the excitation LED 10, $(\phi_{LED}(\lambda))$, for the photo-luminescent diode 5 $(\phi PLD(\lambda))$ and for the photo-luminescent material 31, $(\phi_{PL}(\lambda))$. FIG. 9b shows the transmission curve of the optical filter 32 shown in FIGS. 7 and 8. The filter 32 has a high transmission for both the wavelengths $\lambda_2$ and $\lambda_3$, whereas light of wavelength $\lambda_1$ is attenuated considerably. The transmission curve for the filter 33 is shown in FIG. 9c. The transmission for light of wavelength $\lambda_2$ is high in the filter 33, whereas light of wavelength $\lambda_3$ is greatly attenuated. FIG. 9b shows the transmission property of the filter 34, good transmission occurring at the wavelength $\lambda_3$ but poor transmission at the wavelength $\lambda_2$. If the filter 34 is a band pass filter centered on the wavelength $\lambda_3$, but attenuating light of wavelengths $\lambda_1$ and $\lambda_2$, the filter 32 can be dispensed with.

Figure 10:
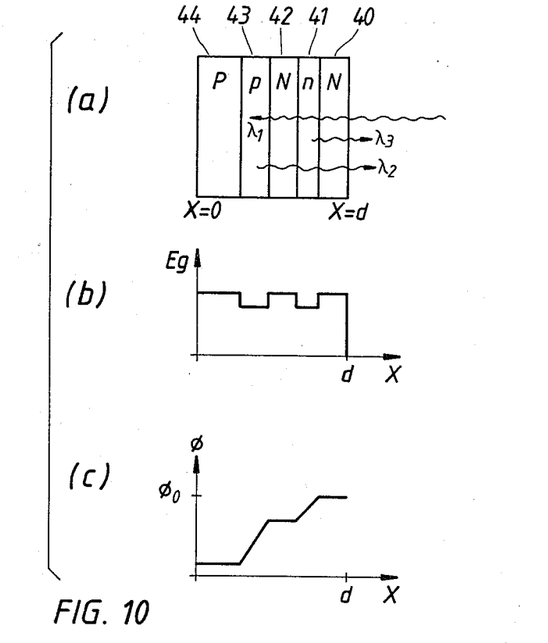

FIG. 10a shows a structure in which the photo-luminescent diode and the material which generates the reference signal, are combined in a single component having a width d and comprising five layers 40-44, doped as shown in FIG. 10a. FIG. 10b shows the band gap for the material in the various layers. The distribution of the light intensity through the structure shown in FIG. 10a is indicated in FIG. 10c. Light of wavelength $\lambda_1$ which enters from the right in FIG. 10a is attenuated mainly in the two layers 41 and 43, each of which has a small band gap. The layers 40, 42 and 44 have a larger band gap transmission and thus have good properties for the excitation light of wavelength $\lambda_1$. Since the layer 41 is surrounded by the layers 40 and 42 with larger band gap, minority charge carriers, holes, which are generated in the layer 41, will be contained there and thus the photo-luminescence efficiency of the layer 41 is high and the layer 41 will be the source of the reference light of wavelength $\lambda_3$. The layer 41 is made so thin that only a part of the excitation light of wavelength $\lambda_1$ is absorbed therein. The excitation light is mainly absorbed in the layer 43, which thus constitutes the active region of the photo-luminescent diode. The light emitted from the layer 43 is of wavelength $\lambda_2 \neq \lambda_3$ and has an intensity which can be controlled by the electrical current flowing through the photo-luminescent diode.

Figure 11:
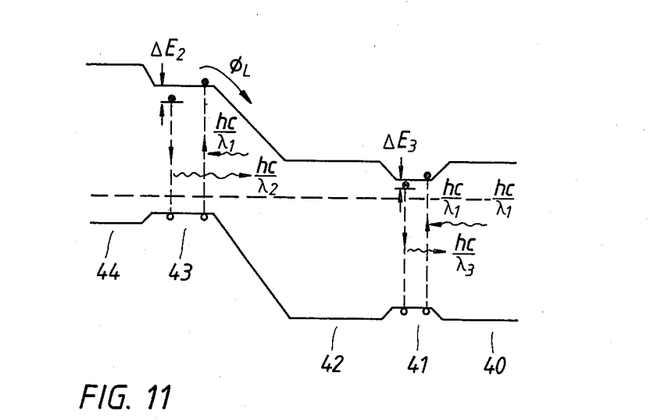
FIG. 11 represents a band diagram for the components according to FIG. 10.

The band diagram for the component in FIG. 10a with a short-circuited photo-luminescent diode is shown in FIG. 11. Excitation light of wavelength $\lambda_1$, which arrives from the right, passes through the layer 40 and generates minority charge carriers, holes, in the layer 41. Some of these holes recombine with electrons, which results in photons of the reference wavelength $\lambda_3$ being emitted and transmitted through the layer 40 to the right. The part of the excitation light which is not absorbed in the layer 41 passes through the layer 42 and is absorbed to a large extent in the layer 43, where minority-charge carriers, electrons, are formed. In the same way as has been described with reference to FIGS. 4 and 5, the electrons will sweep out via the pN junction between the layers 43 and 42, or will recombine in the layer 43. Part of the recombination is radiant, causing light of wavelength $\lambda_2$ to be emitted. The intensity of the emitted light is dependent on the concentration of the minority carriers in the layer 43 and can therefore be controlled on the basis of the current flowing through the photo-luminescent diode. By making the layer 41 of $Al_xGa_{1-x}As$ with an Al content smaller than the Al content in the layers 40, 42 and 44, or by having recombination in centers with different positions in the band gap for the layers 41 and 43, the wavelengths $\lambda_2$ and $\lambda_3$ can be made to be different.

The recombination layer may also be doped with an element selected from the group consisting of Ge, Si, Zn, Mg and Cd.

The photo-luminescent diode may, of course, be made with other barriers to control the concentration of minority charge carriers in the active layer. In addition to a hetero-pn-junction it may be made with a homo-pn-junction, a Schottky barrier, or an MIS structure.

The recombination may be arranged to take place in a material with a monotonously decreasing band gap along the path of the excitation light. The material can then be provided with a barrier, a pn-junction, a Schottky or MIS structure, which results in a depletion layer, the position of which is determined by the voltage applied across the barrier. If the excitation layer has a wavelength which causes a considerable part of the excitation of charge carriers to take place within the distance of some diffusion length from the edge of the depletion layer, the spectral distribution of the emitted light will be dependent on the voltage across the barriers.

The semiconductor material may also be formed from $In_xGa_{1-x}As_yP_{1-y}$, where x and y assume values between 0 and 1 and being adapted such that lattice constants for the measured value in the different layers are as equal as possible.

The photo-luminescent diode may be formed so that the active region is surrounded on both sides by controllable barriers, which will increase the possible degree of modulation for the luminescence by a factor 4 with a given thickness of the structure and a given diffusion length in the material.

Measuring devices, where the photo-luminescent diode is used for measuring a quantity other than temperature, can also provide a measured value of the temperature by analyzing the spectrum of the photo-luminescent diode with methods previously proposed. (See U.S. Pat. No. 4,376,890 filed on the Oct. 6th 1980 in the names of Olof Engström and Christer Ovren and assigned to the assignee of this application. The entire disclosure of this earlier application is incorporated herein by way of reference.) The temperature dependence of the measuring transducer may be adapted to be corrected by means of the measured value of the temperature.

The structure which provides the light for the signal transmission may partially be transparent to the excitation light, so that several structures can be placed one after the other in a bus structure along the optical path. The different structures can emit light of the same wavelength or of different wavelengths, thus enabling wavelength-multiplexed transmission of the measuring signals.

The embodiments described above can be varied in many ways within the scope of the following claims.

What is claimed is:

1. A fiber optically coupled measuring device comprising, an optically energised transducer section for generating signal information in optical form from a body of photo-luminescent material, a receiving section remote from the transducer section for producing a measuring signal from said signal information, means for producing excitation light for the said body in the transducer section, and fiber optic means for feeding excitation light to the transducer section and for passing signal information from the transducer section to the receiving section, wherein, the said body has electrically-dependent photo-luminescent properties such that the optical signal information it generates is modifed by an electrical signal applied thereto, and said transducer section includes transducer means to produce an electrical signal which varies in dependence on a parameter to be measured and to feed said electrical signal to the body.

2. A measuring device according to claim 1, in which the signal information is produced by the recombination of minority charge carriers in said body of photo-luminescent material and is dependent on the concentration of minority charge carriers therein, the concentration of minority charge carriers being arranged to be controlled by the current through or the voltage across, a pn junction in the material.

3. A measuring device according to claim 1, in which the signal information is produced by the recombination of minority charge carriers and is dependent on the concentration of minority charge carriers in the material, the material being included in a diode, and the concentration of minority charge carriers being arranged to be controlled by the electrical signal applied to the diode.

4. A measuring device according to claim 1, in which the said body is made of a material with a monotonously decreasing band gap along the path of the excitation light, the material being provided with a barrier which provides a depletion layer, the position of which is determined by the voltage across the barrier and the excitation light has a wavelength which causes a considerable part of the excitation of charge carriers to take place within the distance of some diffusion length from the edge of the depletion layer, the spectral distribution of the emitted excitation light thus being dependent on the voltage across the barrier.

5. A measuring device according to claim 2, in which the material in which the signal information is generated further comprises a semiconductor material having semiconductor surfaces and a band gap and limited on one side by a material with a larger band gap, excited minority charge carriers thus being prevented from reaching said semiconductor surfaces with a high recombination speed.

6. A measuring device according to claim 2, in which the material, where the signal information is generated, is provided on both sides with means for modulating the concentration of charge carriers so as to increase the degree of luminescence modulation possible.

7. A measuring device according to claim 1, 2 or 3, in which said means in the transducer section which produces the said electrical signal is supplied with electrical power optically generated in the said body of photo-luminescent material.

8. A measuring device according to claim 1, 2 or 3, in which the said body includes a diode and the optical signal information is modulated by a transistor, which is coupled in parallel with the diode and modulates the current output from the diode.

9. A measuring device according to claim 7, in which the electrical power is extracted from the said body via an electrical filter, which reduces the effect of the control by said electrical signal across a pn junction in said photo-luminescent material from the said body on the voltage of the supplied electrical power.

10. A measuring device according to claim 1, 2 or 3, in which the said body includes one part of a material whose luminescence can be electrically controlled, and another part with photo-luminescent properties that are not electrically modulated by the said electrical signal, which other part emits light at a different wavelength from said one part and therefore can serve as a reference signal.

11. A measuring device according to claim 10, in which the other part of the material, which gives a photo-luminescent reference signal, is surrounded by a material with larger band gap, the excited charge carriers thus being contained.

12. A measuring device according to claim 1, 2 or 3, where the parameter to be measured is a parameter other than the temperture in which the wavelength displacement of the spectral distribution of the signal information is sensed and means is provided to analyze the signal information to obtain a value of the temperature, and that the temperature dependence of the transducer means is arranged to be corrected by means of the obtained value of the temperature.

13. A measuring device according to claim 1, 2 or 3, in which the structure in the said body which gives the light for the signal information, is partially transparent to the excitation light so that several structures can be placed one after the other in a bus structure along the optical path, whereby the different structures can emit light of different wavelengths thus enabling a wavelength-multiplexed transmission of the signal information.

14. A measuring device according to claim 1, 2 or 3, in which the transducer means includes several components, the frequency properties of which are changed by the quantity to be measured, the frequency properties being arranged to be analyzed, to extract the measuring signal information and compensate for variations in the optical transmission between the transducer and receiving section.

15. A measuring device according to claim 7, in which the transducer section includes a resistance whose resistivity is changed by the quantity to be measured in such a way that the signal information is transmitted in analog form as a modulation of the light intensity produced by the photo-luminescent material.

16. A measuring device according to claim 10, in which the signal information and the reference signal emitted from the other part of said body with photo-luminescent properties that are not electrically modulated by said electrical signal, are arranged to be separated by optical filters, and the measuring signal is arranged to be compensated for variations in the optical transmission by forming the quotient between the measuring signal and the reference signal.

17. A measuring device according to claim 10, in which the signal information and the reference signal emitted from the other part of said body with photo-luminescent properties that are not electrically modulated by said electrical signal, are arranged to be separated by optical filters, and the measuring signal is arranged to be compensated for variations in the optical transmission by transmitting said measuring signal to a variable amplifier, and employing a regulating loop to maintain the reference signal and thus the optical transmission constant.

18. A measuring device according to claim 2, in which the semiconductor material is $Al_xGa_{1-x}As$, where x has values being 0 and 1.

19. A measuring device according to claim 18, in which a layer in the body where recombination takes place is doped with an element selected from the group consisting of Ge, Si, Zn, Mg and Cd.

20. A measuring device according to claim 2, in which the semiconductor material is $In_xGa_{1-x}As_yP_{1-y}$, x and y assuming values between 0 and 1 and includes different layers adapted such that the lattice constants for the measured value in the different layers are as equal as possible.

21. A measuring device according to claim 10, in which said other part of the body is a frequency converter.

22. A measuring device according to claim 11, in which the material, which surrounds the material which provides the reference signal, is simultaneously included in the said one part which defines a photo-luminescent diode.

* * * * *